United States Patent [19]

Peidous

[11] Patent Number: 5,789,305
[45] Date of Patent: Aug. 4, 1998

[54] LOCOS WITH BIRD'S BEAK SUPPRESSION BY A NITROGEN IMPLANTATION

[75] Inventor: Igor V. Peidous, Singapore, Singapore

[73] Assignee: Chartered Semiconductor Manufacturing Ltd., Singapore, Singapore

[21] Appl. No.: 789,715

[22] Filed: Jan. 27, 1997

[51] Int. Cl.$^6$ ................................................. H01L 21/76
[52] U.S. Cl. ........................ 438/439; 438/440; 438/452
[58] Field of Search ................................. 438/439, 452, 438/440, 229; 148/DIG. 85, DIG. 86

[56] References Cited

U.S. PATENT DOCUMENTS

| | | |
|---|---|---|
| 5,173,444 | 12/1992 | Kawamura et al. |
| 5,229,318 | 7/1993 | Straboni et al. |
| 5,308,787 | 5/1994 | Hong et al. |
| 5,399,520 | 3/1995 | Jang |
| 5,468,657 | 11/1995 | Hsu |
| 5,470,783 | 11/1995 | Chiu et al. |
| 5,472,906 | 12/1995 | Shimizu et al. |

FOREIGN PATENT DOCUMENTS 63-300526  12/1988  Japan.

OTHER PUBLICATIONS

Ahlgren, D.C., et al, "Method for Fabrication of Bird's Beak-Less ROI Using Nitrogen Ion Implant and High Pressure Oxidation", IBM Tech. Disc. Bull. vol. 27, No. 1A, pp. 448-449, Jun. 1984.

Nojiri, K., et al. "A New Isolation Technology for VLSI", Ext. Abs. of the 17th Conf. on Solid State Devices and Materials, Tokyo pp. 337-340, 1985.

Primary Examiner—George R. Fourson
Attorney, Agent, or Firm—George O. Saile; Stephen B. Ackerman; William J. Stoffel

[57] ABSTRACT

The present invention provides a method of fabricating a field oxide layer having a reduced bird's beak using a nitride foot 70 and a first field oxide region 80A as a $N_2$ implant mask. The $N_2$ implant suppresses oxide growth around the perimeter of the field oxide and reduces the bird's beak. A pad oxide layer 20 and a first nitride layer 30 are formed over a substrate. The first nitride layer is partially etched back forming a residual first nitride layer in the areas where the field oxide will be formed. A polysilicon spacer is formed on the sidewalls of the first nitride layer and over a portion of the residual first nitride layer. The residual first nitride layer 31 is etched using the spacer 60 as an etch mask forming a nitride foot 70. The substrate is thermally oxidized in the field oxide area using the first nitride layer and the foot 60 as an oxidation barrier forming a first field oxide layer 80A having a bird's beak 85. Nitrogen ions are then implanted into the bird beak region 90 forming a nitrogen implanted bird's beak region 90. The substrate is thermally oxidized forming a second field oxide layer 80B wherein the bird's beak is reduced due to the nitrogen implant. In other embodiments, the first field oxide layer is removed and a recessed second field oxide layer 82 is formed (with and without the foot 70).

19 Claims, 5 Drawing Sheets

5,789,305

LOCOS WITH BIRD'S BEAK SUPPRESSION BY A NITROGEN IMPLANTATION

BACKGROUND OF INVENTION

1) Field of the Invention

This invention relates generally to fabrication of localized oxidation of a silicon substrate and more particularly to the fabrication of a field oxide isolation layer for a semiconductor device.

2) Description of the Prior Art

The first step in semiconductor manufacturing is the division of a semiconductor substrate into regions where active devices are to be formed and other regions of isolation which electrically separate the active regions. The isolation field oxide dielectric material is routinely silicon dioxide. The most common technique used in the semiconductor industry is known as the local oxidation of silicon (LOCOS). In the practice of LOCOS, the active regions of the silicon substrate are masked by a silicon nitride layer, while the field oxide regions are thermally oxidized to form a field isolation dielectric region. Though fundamentally simple and efficient, the LOCOS process and its progeny, such as the FUROX and SWAMI techniques, exhibit deficiencies which reduce yield or performance in the final semiconductor chip product.

The most frequently encountered deficiency in the prior art techniques is commonly known as the bird's beak problem, wherein the field oxide extends under the masking nitride layer to consume some of the usable active area. The bird's beak creates stress and defects in the silicon in the active areas. Additional problems routinely encountered with known field oxide formation processes include stress induced dislocations at the edges of the active regions, and the presence of a relatively non-planar surface in or adjacent the fully formed field oxide. The non-planar recesses or notches at the edges of the active regions often degrade subsequently formed gate oxide, which can trap conductive layer residuals creating short circuit paths. Solutions to theses problems have been proposed, but routinely involve relatively complex or dimensionally critical fabrication sequences which are costly to proactive or degrade the semiconductor chip yield.

The importance of overcoming the various deficiencies noted above is evidenced by the extensive technological development directed to the subject, as documented by the relevant patent and technical literature. The closest and apparently more relevant technical developments in he patent literature can be gleaned by considering U.S. Pat. No. 5,468,657 (Hsu), U.S. Pat. No 5,399,520 (Jang), U.S. Pat. No. 5,229,318 (Stranboni et al.), U.S. Pat. No. 5,472,906 (Shimizu et al.), U.S. Pat. No. 5,470,783 (Chiu et al.), and U.S. Pat. No. 5,308,787 (Hong et al.).

Though a number of the techniques successfully attack and mitigate the bird's beak problem and usually provide relatively planar final concluding surfaces, the approaches routinely create stress induced dislocations at the edges of the active regions and form topologies which include notches or grooves of sufficient dimension to cause the degradation of subsequently formed gate oxide. The stress induced dislocation are often not even recognized, while the notches or grooves are most often visible in the SEM cross-sections of the final structures.

SUMMARY OF THE INVENTION

It is an object of the present invention to provide a method for fabricating an field oxide layer that reduces the bird's peak length and height.

It is another object of the present invention to provide a method of forming a field oxide layer with thermal oxide using a local nitrogen implant to suppress the bird's peak length and height.

It is another object of the present invention to provide a method of forming a field oxide layer using a first field oxide as an implant mask to implant $N_2$ ions into an area around the perimeter of the field oxide region to suppress the bird's beak.

To accomplish the above objectives, the present invention provides a method of fabricating a field oxide layer having a reduced bird's beak length and height using a nitride foot 70 and a local nitrogen implant. The method begins by forming a pad oxide layer 20 over a semiconductor substrate 10. The substrate has a field isolation area where a field oxide layer 80 will be formed. A first nitride layer 30 is formed over the pad oxide layer 20. A first photoresist layer is formed having a field isolation resist opening over the field isolation area. The field isolation resist opening has a zero or slightly negative bias to compensate foot length. Next, the first nitride layer 30 is partially etched back in the field isolation resist opening forming a residual first nitride layer 31 over the field oxide area and forms sidewalls 42 of the first nitride layer. The first photoresist layer is removed.

A dielectric layer 50 is deposited over the first nitride layer 30 and the residual nitride layer 31. The dielectric layer 50 is anisotropically etched forming a spacer 60 on the sidewall 42 of the first nitride layer. The residual first nitride layer 31 is etched using the spacer 60 as an etch mask forming a foot 70 composed of the residual nitride layer under the spacer 60. The substrate is thermally oxidized in the field oxide area using the first nitride layer and the foot 60 as an oxidation barrier forming a first field oxide layer 80A having a bird's beak 85. The substrate has bird's beak regions 90 under the bird's beak 85.

Nitrogen ions are then implanted into the bird beak region 90 forming a nitrogen implanted bird's beak region 90 under the bird's beak 85. The energy of the nitrogen implantation must be insufficient for the ion penetration thorough the first nitride layer and the local field oxide layer 80A, but high enough for the local nitrogen doping the bird's beak region 90.

In a first embodiment, the substrate is thermally oxidized forming a second field oxide layer 80B wherein the bird's beak is smaller due to the nitrogen implanted bird's beak region which retards oxide growth in the bird's beak region.

In a second embodiment of the invention, the nitride feet 70 are removed after the nitrogen implant of the bird's beak region. Then a second field oxide region 80B is then regrown in a second thermal oxidation process.

In a third embodiment of the invention, the first field oxide region 8A and the nitride feet 70 are removed after the nitrogen implant of the bird's beak region. Then a second recessed field oxide region 80B is then grown in a second thermal oxidation process.

In a fourth embodiment of the invention, the first field oxide region 8A is removed after the nitrogen implant of the bird's beak region. Then a second recessed field oxide region 80B is then grown in a second thermal oxidation process.

The present invention provides a process for an field oxide layer that reduces the bird's beak length and height. The combination of the nitride foot 70 and the $N_2$ implant reduce the oxidation in the bird's beak region thus reducing the size of the bird's beak. The nitride foot acts as an oxygen diffusion barrier while the $N_2$ implant reduces the silicon

3 oxidation rate in the bird's beak alrea. The invention's suppression of the bird's beak reduces stress on the trench sidewall. This reduced stress reduces silicon defects which increases yields.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Figure 8:
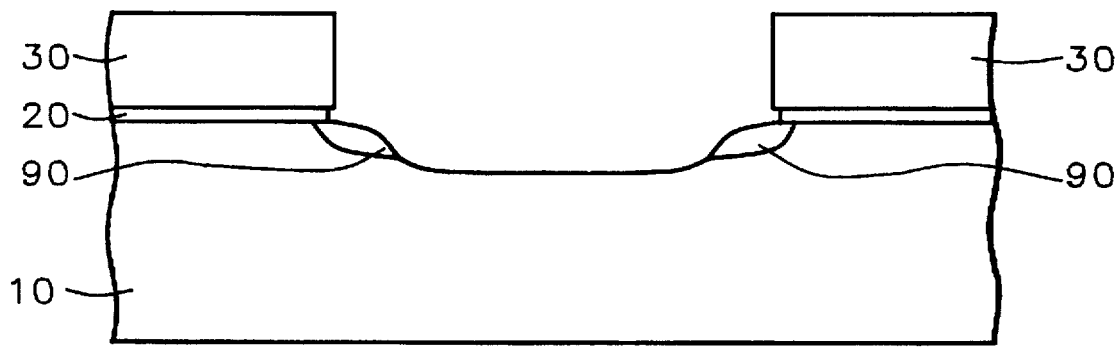
FIG. 8 shows a cross sectional view of a third embodiment of the present invention where the first field oxide 80A and nitride feet 70 are removed and the substrate is oxidized a second time to form a second recessed field oxide layer 82 of the desired thickness according the method of the present invention.

The present invention will be described in detail with reference to the accompanying drawings. The present invention provides a method of fabricating a field oxide layer having a reduced bird's beak length and height. The method uses a nitride foot 70 and a local nitrogen implant to reduce oxide growth in the bird's beak region. The method uses a first field oxide region as a implant mask to implant $N_2$ ions around the perimeter of the field oxide region. FIG. 8 shows a flow chart of the four embodiments of the present invention.

Figure 1:
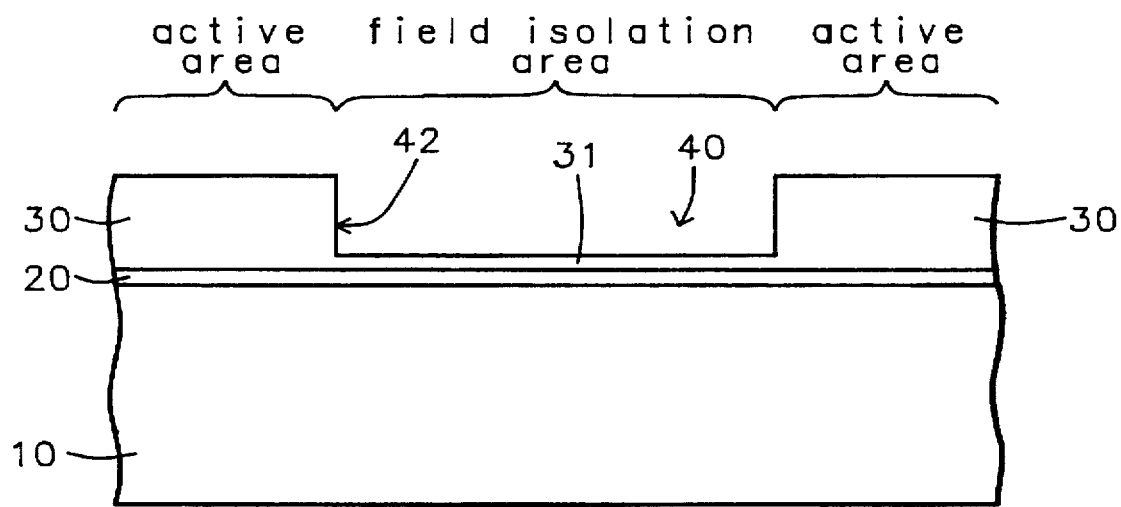
FIGS. 1 through 6 are cross sectional views for illustrating a method for manufacturing forming a field oxide with a reduced bird's beak according to the present invention.

The method begins by forming a pad oxide layer 20 over a semiconductor substrate 10 as shown in FIG. 1. The substrate is preferably a silicon semiconductor substrate with a (100) orientation and p-type background doping. The substrate has active areas 12 where devices will be formed and field isolation areas 14 where field oxide layers will be grown. The pad oxide layer 20 is preferably composed of silicon oxide having thickness in a range of between about 100 and 300 Å. The pad oxide layer is preferably formed using a thermal oxidation process.

Still referring to FIG. 1, a first nitride layer 30 is formed over the pad oxide layer 20. The nitride layer 30 be formed of silicon nitride or oxynitride and is more preferably formed of silicon nitride. The layer 30 can be any material that acts as an oxygen diffusion barrier. The first nitride layer 30 preferably has a thickness in a range of between about 140 and 200 nm The silicon nitride layer 30 can be formed by reacting silane and ammonia at atmospheric pressure at 700° to 900° C., or by reacting dichlorosilane and ammonia at reduced pressure at approximately 700° C. Also, silicon nitride can be formed by plasma enhance chemical vapor deposition by reacting silane with ammonia or nitrogen in a glow discharge between 200° and 350° C. The first nitride layer 30 is preferably formed using a LPCVD process.

A first photoresist layer (not shown) is formed over the first nitride layer 30 having a field isolation resist opening over the field isolation area. The field isolation resist opening is slightly smaller that the field isolation area 14 so that a portion of the field isolation along the perimeter is covered by the resist.

Next, the first nitride layer 30 is partially etched back in the field isolation resist opening forming a residual first nitride layer 31 over the field oxide area and forming sidewalls 42 of the first nitride layer. The residual first nitride layer 31 preferably has a thickness in a range of between about 100 and 600 Å and more preferably a thickness in a range of between about 200 and 300 Å. Subsequently, the first photoresist layer is removed.

Figure 2:
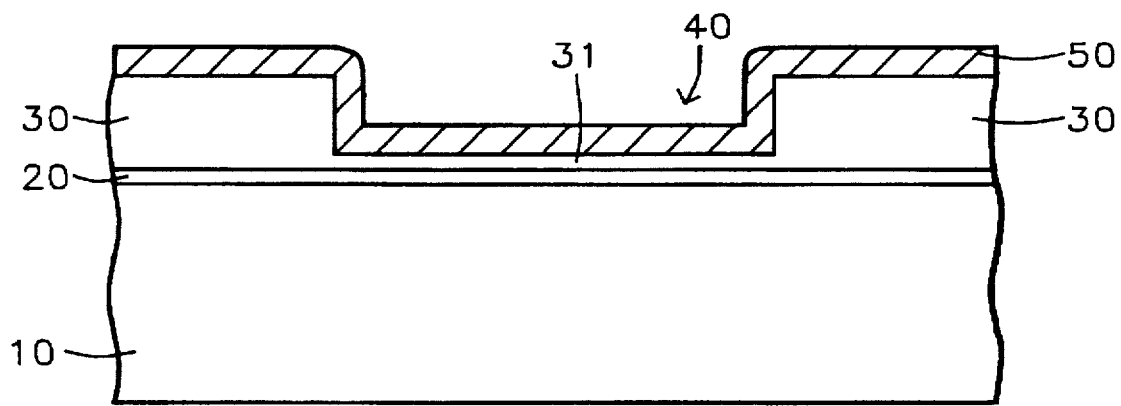
Figure 3:
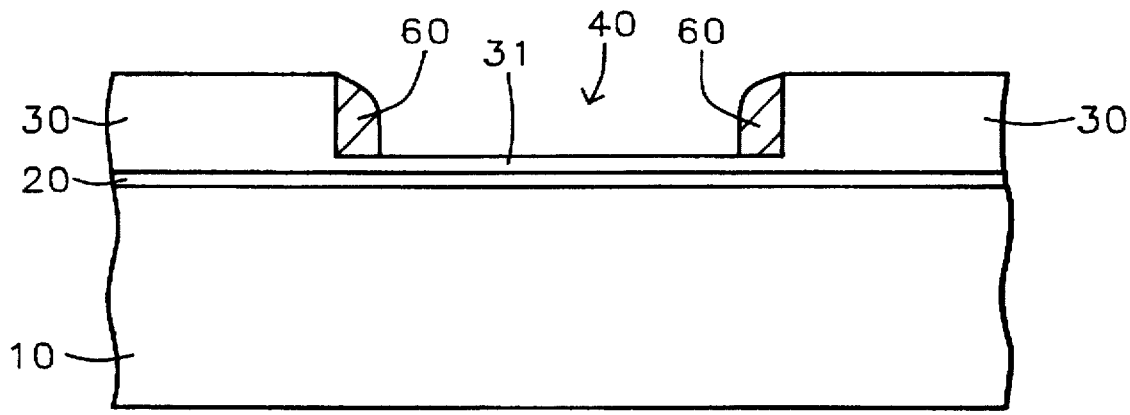

As shown in FIGS. 2 and 3, a spacer 60 is formed on the sidewall 42 of the first nitride layer. To form the spacer, a dielectric layer (e.g., polysilicon) layer 50 is deposited over the first nitride layer 30 and the residual nitride layer 31. The dielectric layer 50 can be formed of any material that has a different etch rate than the first nitride layer. The dielectric layer can be composed of polysilicon, SiO2, oxynitride, or similar materials. The dielectric layer 50 preferably has a thickness in a range of between about 0.05 and 0.2 µm and more preferably a thickness in a range of between about 0.1 and 0.15 µm.

Referring to FIG. 3, the dielectric layer 50 is preferably anisotropically etched forming a spacer 60 on the sidewall 42 of the first nitride layer. The anisotropic etch of the dielectric layer is performed using a reactive ion etch, such as a Carbon fluoride and a halogen gas (e.g., $CF_4$—$Cl_2$). The spacer 60 preferably has a width in a range of between about 0.05 and 0.2 µm and more preferably between about 0.1 and 0.15 µm.

Figure 4:
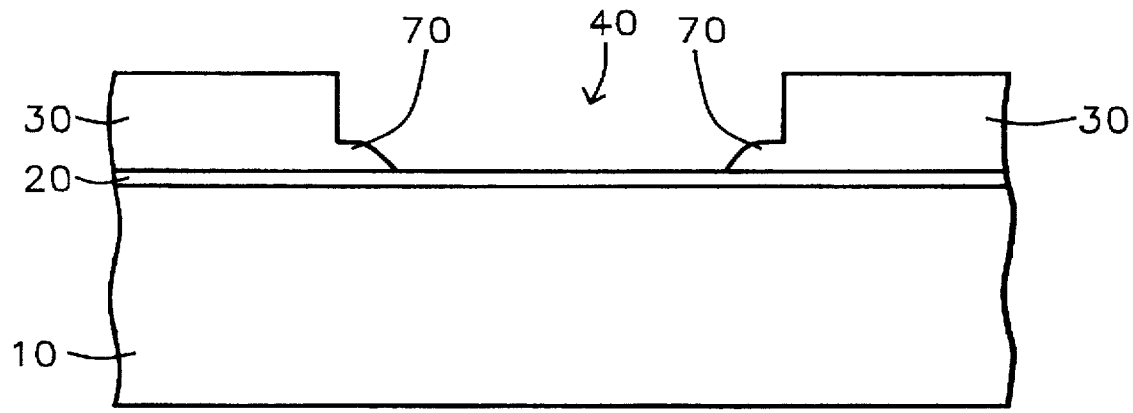

As shown in FIG. 4, the residual first nitride layer 31 is etched using the spacer 60 as an etch mask forming a foot 70 composed of the residual nitride layer 31 under the spacer 60. The foot 70 preferably has a height in a range of between about 100 and 600 µM and a length in a range of between about 0.1 and 0.15 um. The foot will act as an oxygen diffusion barrier to retard oxidation under the bird's beak.

Figure 5:
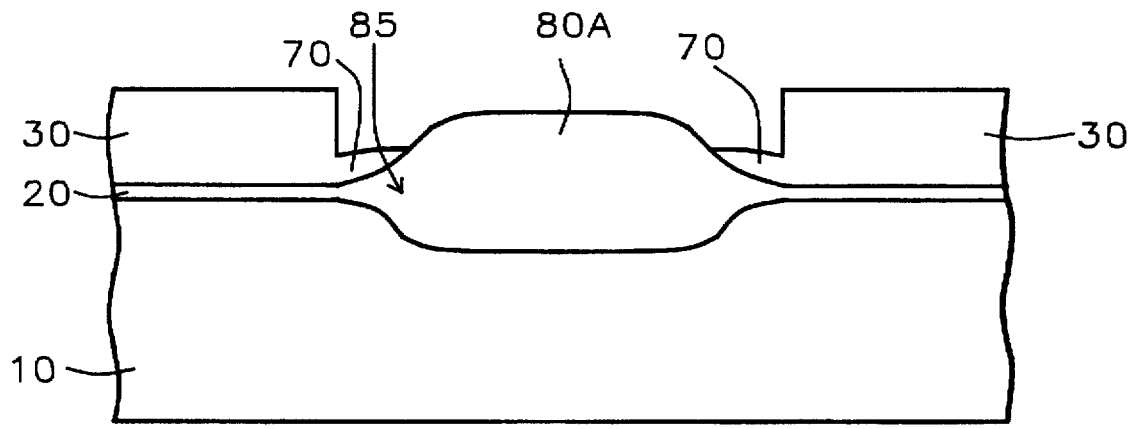

Displayed in FIG. 5, the substrate is thermally oxidized in the field isolation area 14 using the first nitride layer and the foot 60 as an oxidation barrier forming a first field oxide layer 80A possibly having a (small, or reduced) bird's beak 85. The substrate has bird's beak regions 90 along the perimeter of the field isolation area 14 or under the small bird's beak 85. The first field oxide layer 80A preferably thickness in a range of between about 1200 and 2200 Å. This field oxide layer 80A can be used as the isolation and product devices can be formed in the produce areas.

Figure 6:
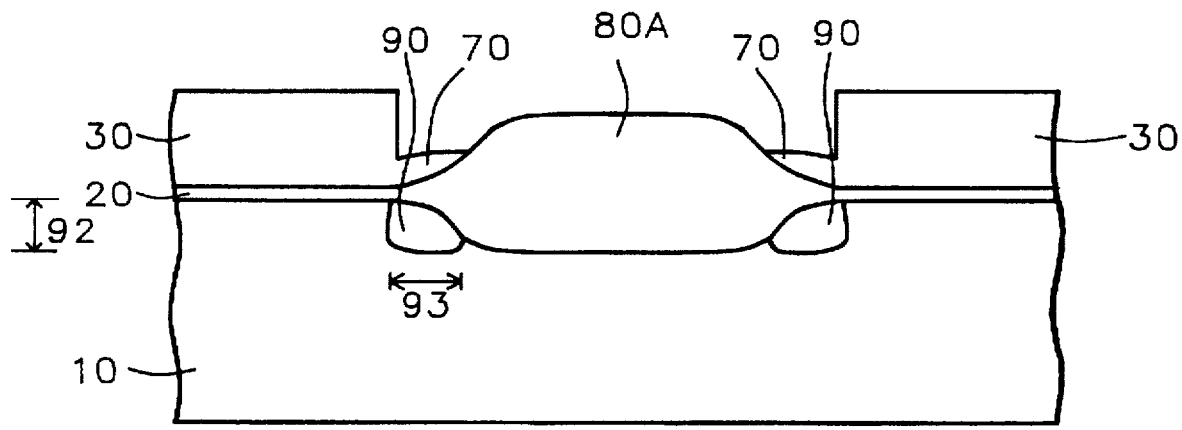

As shown in FIG. 6, nitrogen ions are then implanted into the bird beak region 90 forming a nitrogen implanted bird's beak region 90 under the bird's beak 85. The energy of the nitrogen implantation must be insufficient for the nitrogen ions to penetrate through first nitride layer 30 and the local field oxide layer 80A over the active areas. Also, the energy of the nitrogen implantation must be insufficient to penetrate the first field oxide layer 80A in the thicker central portions of the field isolation area 14. In addition, the nitrogen implant energy must high enough for the local nitrogen doping in the bird's beak region 90 on the perimeter of the field oxide region 80A. The incorporation of nitrogen ions into the silicon substrate around the bird's beak region will inhibit the subsequent oxidation rate in that region. The invention used the first field oxide region 80A as a $N_2$ implant mask so that the whole field isolation area 14 is not implanted. That would inhibit oxidation throughout the whole region and not produce a field oxide with the proper thickness and profile. Also, theoretically a precise photoresist mask could be used as an implant mask, but the present photo process do not have acceptable and tolerances (e.g., sum of alignment, overlay and dimension tolerances must be less than about 0.1 µm) and are expensive.

For a first nitride layer 30 with a thickness between about 140 and 200 nm over the active areas, the nitrogen ion implant will preferably have the following parameters: an energy in a range of between about 20 and 60 Kev, a dose in a range of between about 1E13 and 1E17 atoms/$cm^2$. The concentration of nitrogen in the nitrogen implanted bird's beak region 90 is preferably in a range of between about 1E18 and 1E21 atoms/$cm^3$ and more preferably in a range of between about 1E20 and 1E21 atoms/$cm^3$. The nitrogen implanted bird's beak region 90 preferably extends from the surface to a depth 92 below the substrate surface in a range of between about 0.5 and 0.15 µm. The nitrogen implanted bird's beak region 90 preferably has a width 93 in a range of between about 0.05 and 0.2 µm.

Figure 10:
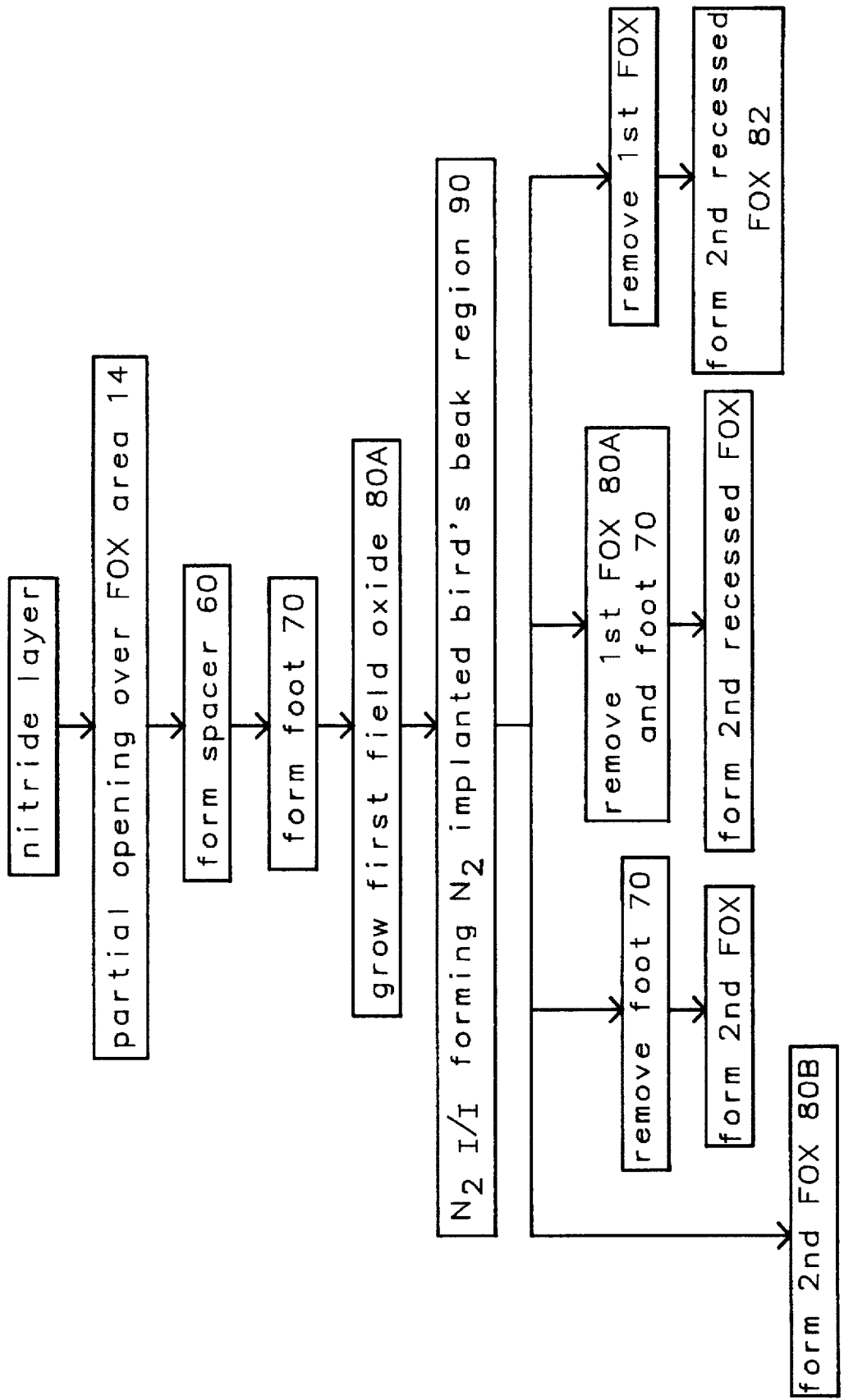
FIG. 10 shows a flowchart of the four embodiments of the method of the present invention.

FIG. 10 shows a flow chart of the process and the four embodiments of the present invention. These embodiments are explained below.

Figure 7:
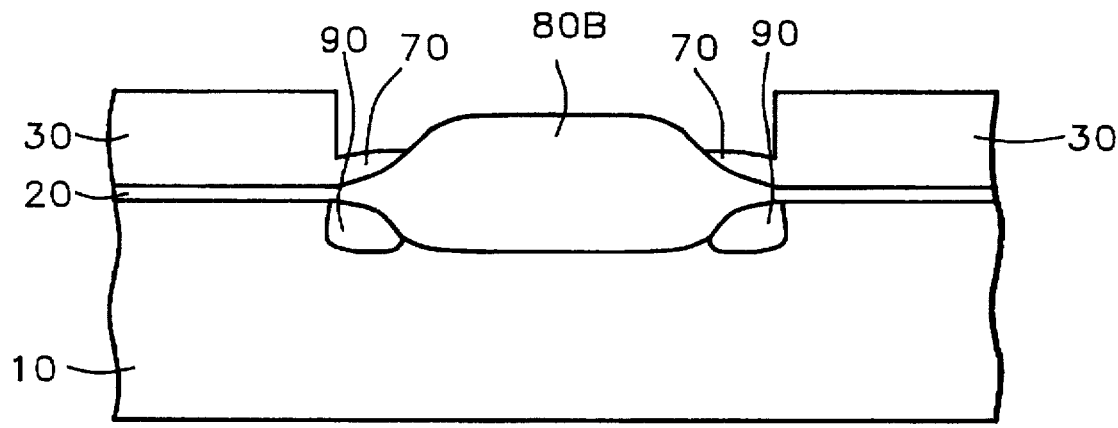
FIG. 7 shows a cross sectional view of a first embodiment of the present invention where the first field oxide is oxidized a second time to form a second field oxide layer of the desired thickness according the method of the present invention.

As FIG. 7, In a first embodiment, the substrate is thermally oxidized forming a second field oxide layer 80B wherein the bird's beak is smaller due to the nitrogen implanted bird's beak region which retards oxide growth in the bird's beak region. The second field oxide layer 82 preferably a thickness in a range of between about 3000 and 5000 Å.

In the second embodiment, the foot is removed before the formation of the $2^{nd}$ field oxide 80B.

Figure 9:
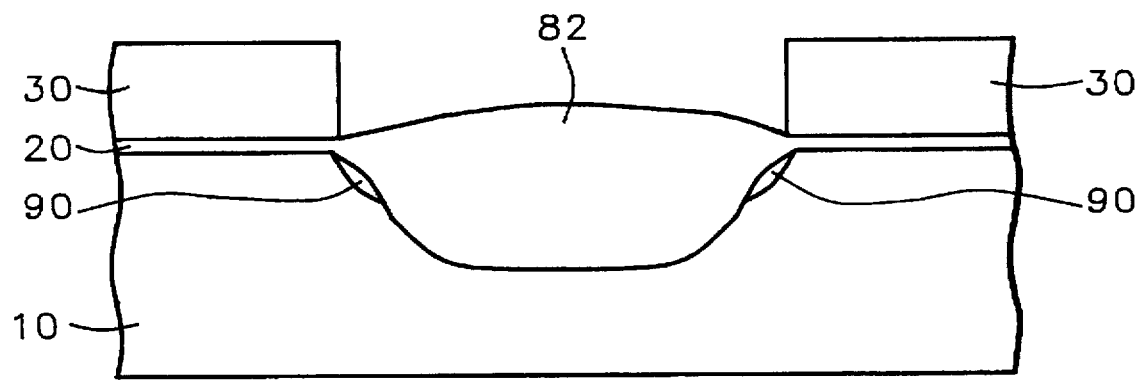
FIG. 9 shows the growth of the second field oxide region 82 in the $3^{rd}$ and $4^{th}$ embodiments of the invention.

In a third embodiment of the invention shown in FIG. 8, the nitride feet 70 and the first field oxide regions 80A are removed before the second thermal oxidation. Then a second recessed field oxide region 82 is then regrown in a second thermal oxidation process. The nitride feet 70 can be removed using reactive plasma etch. The first field oxide region can be removed using any etch selective to silicon oxide, such as a buffered HF or a RIE etch such using a carbon fluoride reagent. The first field oxide is preferably removed using an HF etch. See FIGS. 8 and 9.

In the fourth embodiment, only the first field oxide 80A is removed and the feet 70 remain in place. Then the second recessed field oxide region 82 is then regrown in a second thermal oxidation process. See FIG. 9.

Each embodiment has different advantages. In the second embodiment, the advantage of removing only the nitride foot 70 before the second oxidation is that the nitride feet will not retard the oxidation rate in the isolation area (the field oxide will be thicker). In the fourth embodiment, the advantage of removing only the first field oxide before the second FOX oxidation is that the final (second) field oxide will be recessed into the silicon thus making the surface of the structure smoother. In the third embodiment, the advantage of removing both the foot and first field oxide before the second FOX oxidation is the sum of the above listed advantages.

The present invention provides a process for an field oxide layer that reduces the bird's beak length and height.

The local self alignment to the edge of the mask of the $N_2$ implant reduces the oxidation in the bird's beak region thus reducing the size of the bird's beak. The nitride foot acts a temporary mask to form a structure for local implantation of nitrogen with out additional lithography. The first field oxide layer 80A acts as a self-aligned implant mask for the $N_2$ implant into the bird's beak area. This $N_2$ implant suppresses the growth of the bird's beak. The nitride foot also as an oxygen diffusion barrier while the $N_2$ implant reduces the silicon oxidation rate in the bird's beak area. The invention's suppression of the bird's beak reduces stress on the trench sidewall. This reduced stress reduces silicon defects which increases yields.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a field oxide layer having a reduced bird's beak length and height using a nitride foot and a local nitrogen implant, comprising the steps of:

a) forming a pad oxide layer over a semiconductor substrate; said substrate having a field isolation area where a first field oxide layer and a second field oxide layer will be formed;

b) forming a first nitride layer over said pad oxide layer;

c) partially etching said first nitride layer over said field isolation area forming a residual first nitride layer over said field oxide area and forming sidewalls of said first nitride layer;

d) forming a spacer on said sidewalls of said first nitride layer;

e) etching said residual first nitride layer using said spacer as an etch mask forming a foot composed of said residual first nitride layer under said spacer;

f) removing said spacer;

g) thermally oxidizing said substrate in said field oxide area using said first nitride layer and said foot as an oxidation barrier forming a first field oxide layer, said substrate having bird's beak regions around the perimeter of said first field oxide layer; and h) implanting nitrogen ions into said bird beak region using said first field oxide layer as a implant mask, forming a nitrogen implanted bird's beak region in said substrate.

2. The method of claim 1 which further includes:

a) thermally oxidizing said substrate forming a second field oxide layer wherein said nitrogen implanted bird's beak region retards oxide growth in said bird's beak region thereby reducing bird's beak growth.

3. The method of claim 1 which further includes:

a) removing said foot;

b) thermally oxidizing said substrate forming a second field oxide layer wherein said nitrogen implanted bird's beak region retards oxide growth in said bird's beak region thereby reducing bird's beak growth.

4. The method of claim 1 which further includes:

a) removing said foot and first field oxide layer;

b) thermally oxidizing said substrate forming a second recessed field oxide layer wherein said nitrogen implanted bird's beak region retards oxide growth in said bird's beak region thereby reducing bird's beak growth.

5. The method of claim 1 which further includes:
   a) removing said first field oxide layer;
   b) thermally oxidizing said substrate forming a second recessed field oxide layer wherein said nitrogen implanted bird's beak region retards oxide growth in said bird's beak region thereby reducing bird's beak growth.

6. The method of claim 1 wherein said pad oxide layer composed of silicon oxide having thickness in a range of between about 100 and 300 Å.

7. The method of claim 1 wherein said first nitride layer has a thickness in a range of between about 140 and 200 nm.

8. The method of claim 1 wherein said spacer has a thickness in a range of between about 0.05 and 0.2 μm.

9. The method of claim 1 wherein said foot having a height in a range of between about 100 and 600 Å and a length in a range of between about 0.1 and 0.15 μm.

10. The method of claim 1 wherein the energy of the nitrogen implantation is insufficient for the ion penetration thorough said first nitride layer and said first field oxide layer outside of said bird's beak region, but high enough to nitrogen dope said bird's beak region.

11. The method of claim 1 wherein said nitride layer is composed of a material selected from the group consisting of silicon nitride and oxynitride.

12. The method of claim 2 wherein said second field oxide layer has a thickness in a range of between about 3000 and 5000 Å.

13. The method of claim 1 wherein said nitrogen implanted bird's beak region has $N_2$ concentration in a range of between about 1E18 and 1E21 atoms/cm$^3$ and said nitrogen implanted bird's beak region extends from the substrate surface to a depth below the substrate surface in a range of between about 0.5 and 0.15 μm and said nitrogen implanted bird's beak region has a width in a range of between about 0.05 and 0.2 μm.

14. A method of fabricating a field oxide layer having a reduced bird's beak length and height using a nitride foot and a local nitrogen implant, comprising the steps of:
   a) forming a pad oxide layer over a semiconductor substrate; said substrate having a field isolation area where a first and second field oxide layer will be formed;
   b) forming a first nitride layer over said pad oxide layer;
   c) partially etching said first nitride layer over said field isolation area forming a residual first nitride layer over said field oxide area and forming sidewalls of said first nitride layer;
   d) depositing a dielectric layer over said first nitride layer and said residual nitride layer;
   e) anisotropically etching said dielectric layer forming a spacer on said sidewalls of said first nitride layer;
   f) etching said residual first nitride layer using said spacer as an etch mask forming a foot composed of said residual nitride layer under said spacer; said foot having a length in a range of between about 0.1 and 0.15 μm;
   g) removing said spacer;
   h) thermally oxidizing said substrate in said field oxide area using said first nitride layer and said foot as an oxidation barrier forming said first field oxide layer, said substrate having bird's beak regions around the perimeter of said first field oxide layer; said first field oxide layer having a thickness in a range of between about 1200 and 2200 Å; and
   i) implanting nitrogen ions into said bird beak region using said first field oxide layer as a implant mask, forming a nitrogen implanted bird's beak region; the energy of the nitrogen implantation is insufficient for the ion penetration thorough said first nitride layer and said first field oxide layer, but sufficient to nitrogen dope the outer perimeter of the field isolation area.

15. The method of claim 14 which further includes:
   a) thermally oxidizing said substrate forming said second field oxide layer wherein said nitrogen implanted bird's beak region retards oxide growth in said bird's beak region thereby reducing bird's beak growth.

16. The method of claim 14 which further includes:
   a) removing said foot;
   b) thermally oxidizing said substrate forming said second field oxide layer wherein said nitrogen implanted bird's beak region retards oxide growth in said bird's beak region thereby reducing bird's beak growth.

17. The method of claim 14 which further includes:
   a) removing said foot and first field oxide layer;
   b) thermally oxidizing said substrate forming said second recessed field oxide layer wherein said nitrogen implanted bird's beak region retards oxide growth in said bird's beak region thereby reducing bird's beak growth.

18. The method of claim 14 which further includes:
   a) removing said first field oxide layer;
   b) thermally oxidizing said substrate forming said second recessed field oxide layer wherein said nitrogen implanted bird's beak region retards oxide growth in said bird's beak region thereby reducing bird's beak growth.

19. The method of claim 14 wherein said nitrogen implanted bird's beak region has $N_2$ concentration in a range of between about 1E18 and 1E21 atoms/cm$^3$, and said nitrogen implanted bird's beak region extends from the substrate surface to a depth below the substrate surface in a range of between about 0.5 and 0.15 μm and said nitrogen implanted bird's beak region has a width in a range of between about 0.05 and 0.2 μm.

* * * * *